United States Patent
Saha et al.

(10) Patent No.: US 6,483,435 B2
(45) Date of Patent: Nov. 19, 2002

(54) METHOD AND DEVICE OF FAULT LOCATION FOR DISTRIBUTION NETWORKS

(75) Inventors: Murari Saha, Vasteras (SE); Eugeniusz Rosolowski, Warsaw (PL)

(73) Assignee: ABB AB, Vasteras (SE)

( * ) Notice: Subject to any disclaimer, the term of this patent is extended or adjusted under 35 U.S.C. 154(b) by 0 days.

(21) Appl. No.: 09/901,638

(22) Filed: Jul. 11, 2001

(65) Prior Publication Data

US 2002/0053912 A1 May 9, 2002

(30) Foreign Application Priority Data

Jul. 11, 2000 (SE) .............................. 0002608

(51) Int. Cl.$^7$ .............................................. G08B 21/00
(52) U.S. Cl. ........................ 340/650; 340/651; 324/525; 361/80
(58) Field of Search ................................ 340/650, 651, 340/657, 658, 660, 664, 310.01, 310.05; 324/521, 522, 525; 361/63, 65, 80, 82

(56) References Cited

U.S. PATENT DOCUMENTS

| | | | |
|---|---|---|---|
| 3,732,464 A | * 5/1973 | Miki et al. ............... | 361/80 |
| 4,329,727 A | * 5/1982 | Premerlani .............. | 361/80 |
| 5,773,980 A | 6/1998 | Yang ....................... | 324/525 |
| 5,796,258 A | * 8/1998 | Yang ....................... | 324/522 |
| 5,839,093 A | * 11/1998 | Novosel et al. ............ | 324/525 |
| 6,034,592 A | 3/2000 | Jurisch et al. ........... | 340/310.05 |
| 6,097,280 A | * 8/2000 | Takeda et al. ............ | 340/310.02 |

FOREIGN PATENT DOCUMENTS

| WO | WO 96/32652 | 10/1996 |
|---|---|---|
| WO | WO 99/46609 | 9/1999 |

* cited by examiner

*Primary Examiner*—Van Trieu
(74) *Attorney, Agent, or Firm*—Connolly Bove Lodge & Hutz LLP (57) ABSTRACT

The present invention relates to a method for location of a fault which has occurred on one of a plurality of lines in a power distribution network where the location is performed with the measured values of the common supply voltage of the plurality of lines and the currents of the plurality of lines after the occurrence of a fault; calculating the equivalent positive-sequence impedance $\underline{Z}_{1k}{}^f$ and zero-sequence impedance $\underline{ZZ}_{0k}{}^f$ of the network in a pre-fault steady state for all M nodes based on knowledge of the configuration and topology of the network, and obtaining, via a superordinate protection system, which of plurality of lines has become faulty and which type of fault has occurred. The invention is characterised by calculating the equivalent impedance $\underline{Z}_{ek}$ using fault loop calculation depending on the fault type as

$$Z_{ek} = \begin{cases} Z_{1k}^f - Z_{1f} & \text{-for phase-to-phase fault-loop} \\ Z_{1k}^f + k_I Z_{0k}^f - Z_{1N} & \text{-for phase-to-ground fault-loop} \end{cases}$$

where $$k_I = \frac{I_{pN}}{3I_p - I_{pN}}, \quad Z_{1N} = \frac{V_{ph}}{I_p - I_{pN}/3},$$

and: $\underline{V}_{ph}$ -voltage at the faulty phase, $\underline{Z}_{1f}$ - positive-sequence fault-loop impedance obtained from measurements, $\underline{I}_p$, $\underline{I}_{pN}$ - adequately: fault-loop and residual currents obtained from measurements, and checking if $\mathrm{Im}(\underline{Z}_{ek}) \leq 0$, k=1,2, . . . M wherein, upon being fulfilled, the distance to fault is chosen.

20 Claims, 6 Drawing Sheets

METHOD AND DEVICE OF FAULT LOCATION FOR DISTRIBUTION NETWORKS

TECHNICAL FIELD

The present invention relates to a method for location of a fault which has occurred on one of the lines or feeders in a distribution network where the location is performed with the aid of measured values of the common supply voltage of the lines and the currents of the lines after the occurrence of a fault; calculating the equivalent positive-sequence impedance $Z_{1k}{}^f$ and zero-sequence impedance $Z_{0k}{}^f$ of the network in a pre-fault steady state for all M nodes based on knowledge of the configuration and topology of the network, and obtaining, via a superordinate protection system, information about which line has become faulty and which type of fault has occurred. The invention also relates to a device for carrying out the method.

BACKGROUND OF THE INVENTION

Fault location in distribution networks (DN), cable or overhead, is normally an integral part of superordinate protection systems relating to faults on circuit breakers, contactors, relays etc. With the aid of various protection, monitoring and so-called expert systems, the faulty line may be determined. In the document, the word line is used, but in this context it is to be understood that it equally applicable to feeders or cables, and combinations thereof.

The state of the art as regards fault location in a DN comprises two fundamentally different methods. One of the methods is based on the provision of a fault locator on each line, which entails heavy investment costs, and the other method comprises measuring centrally the voltage and the sum current for all the DN lines in the DN station.

The latter method involves a plurality of problems, which make it difficult to obtain a relatively reliable measure of the distance to the fault:

- in connection with fault location, assumptions are often made that the current in a faulty line is equal to the difference between measured current after and prior to the occurrence of a fault, which introduces a certain error in the determination of the distance;
- if the line comprises motor drives, this may lead to power being fed into the DN, and such feeding of power is difficult to compensate for;
- the line may comprise one or more substations and closed loops;
- a fault locator is programmed for a given number of branches with respective loads at given distances from the DN. Since connection and disconnection of parts of the line may occur at different times, it is important to update programmed data of the network configuration and topology.

In an article entitled "Determining Locations on Faults in Distribution Systems", Developments in Power System Protection, Mar. 25–27, 1997, Conference Publication No. 434, IEE 1997, a method for determining distance is described, wherein a central measurement of the voltage and the sum current for all the lines is performed. The fault-located line may have a plurality of distributed branch points, nodes, where also some branches have parallel loads. The starting-point is voltage and current measured at the DN station prior to and after the occurrence of a fault, whereupon the respective positive-sequence components are determined. It is assumed that the data of the line between each node and the load at each node prior to a fault are known.

A first assumed value of the distance to the fault is determined on the basis of the positive-sequence impedance of the remote end prior to the fault. The positive-sequence components of current and voltage at the fault node after the occurrence of the fault are then used for determining the first calculated value of the distance to the fault. These two values are compared with each other, and if the difference is greater than a least value set in advance, a new assumption is made as to between which nodes the fault is located, based on the value now calculated. This provides a new load model and a second calculated value of the distance to the fault. This value is then compared with the first calculated value, which comparison may result in an additional number of iterations until the difference value between two consecutively calculated values lies within the permissible values. The method does not permit fault location in case of a three-phase fault.

One way of making the determination of the distance to a fault when performing measurement on the relevant faulty line is clear from an article entitled "An Interactive Approach to Fault Location on Overhead Distribution Lines with Load Taps", Development in Power System Protection, Mar. 25–27, 1997, Conference Publication No. 434, IEE, 1997, in which the term "overhead distribution lines" relates to an overhead line intended for medium voltages. This article presents a technique and an algorithm for fault location on overhead lines based on determining the difference in voltage prior to and after the occurrence of a fault at an assumed fault point on the line based on voltages measured in the supply station of the line, prior to and after the occurrence of a fault. This voltage is then used for checking the currents in the non-faulty phase at the assumed fault point. Only when the assumed fault point is correct, will the current in the non-faulty phases assume a value near zero. This method does not permit any fault location of a three-phase fault and the voltage measurement must be performed in the supply station of the line in question.

Further problems with fault location in DN's, are that, in contrary to transmission lines, the distribution networks are usually non-homogeneous, with branches and loads along the line which makes the fault location (FL) accuracy difficult. A general scheme of such a network is presented in FIG. 1. The fault-loop impedance estimated by FL at the substation and used as a direct measure of a distance to fault is corrupted by intermediate loads and branches that makes accurate fault location difficult. Three fundamental factors contribute to this:

- a fault-loop as seen from the substation may contain different cable sections with different equivalent parameters what can not be regarded as homogenous circuit, therefore no classical FL methods may be used;
- in the case of a DN line, there are often loads located between the fault point and the busbar; since the loads change and are unknown to the FL it is difficult to compensate for them;
- resistance at the fault point introduces equivalent fault impedance which value and character depends on the equivalent network parameters beyond the fault, this is also difficult to compensate for.

BRIEF DESCRIPTION OF THE INVENTION

By means of a method and a device according to the invention, determination of the distance to the fault on a faulty line of a Distribution Network (DN) may be performed, wherein the method takes into consideration the influences of non-homogenities, branches and loads of the DN. Further the method according to the invention is not dependent of where in the network measurements are being made, i e does not depend on if the currents and voltages of each line or branch are measured separately or if the voltage and sum current for all the lines are measured centrally.

The principle of distance determination according to the invention is particularly useful for cable networks but may also advantageously be used for overhead line networks.

The method proposed for this invention overcomes the difficulties discussed above by delivering a method for fault location in distribution networks characterised by the features of claim 1. First, the equivalent positive- ($\underline{Z}_{1k}^{f}$) and zero-sequence ($\underline{Z}_{0k}^{f}$) impedance of the network is computed in pre-fault steady-state for all M nodes of the network based on existing topology, loads and feeder parameters. Second, after the fault, the specific fault-loop parameters are calculated depending on the fault-loop type (phase-phase or phase-ground) and the place of measurements (at the supplying transformer or at the faulty feeder).

The fault location is determined as a result of checking the following set of conditions:

$Im(\underline{Z}_{ek}) \leq 0$, $k=1,2,\ldots M$ (A)

where:

$$\underline{Z}_{ek} = \begin{cases} Z_{1k}^{f} - Z_{1f} & \text{-for phase-to-phase fault-loop} \\ Z_{1k}^{f} + \underline{k}_{l} Z_{0k}^{f} - Z_{1N} & \text{-for phase-to-ground fault-loop} \end{cases}$$ (A)

$$\underline{k}_{l} = \frac{I_{pN}}{3I_{p} - I_{pN}}, \quad Z_{1N} = \frac{V_{ph}}{I_{p} - I_{pN}/3}$$

and: $\underline{V}_{ph}$ - voltage at the faulty phase, $\underline{Z}_{1f}$ - positive-sequence fault-loop impedance obtained from measurements, $\underline{I}_{p}$, $\underline{I}_{pN}$ - adequately: fault-loop and residual currents obtained from measurements.

The final distance to fault will be chosen when the condition as in (A) is fulfilled. The method of calculation of the parameters ($\underline{Z}_{1f}, \underline{I}_{p}, \underline{I}_{pN}$) depends on the place of measurement (at the substation or the feeder).

With the present invention it is possible to determine the distance to fault in a very accurate and reliable way. Especially in distribution networks including a plurality of different line or cable sections and with branches and loads along the lines, the present invention takes this into account by utilising fault loop approaches depending on the type of fault and going through the consecutive nodes of the network calculating the residual impedance in order to arrive at a distance value.

These and other aspects of, and advantages with the present invention will become apparent from the detailed description and from the accompanying drawings.

BRIEF DESCRIPTION OF THE DRAWINGS

In the following detailed description of the invention, reference will be made to the accompanying drawings, of which FIG. 4a shows an equivalent scheme for a phase-to-phase fault loop from the substation to the fault point, FIG. 4b the scheme according to FIG. 4a beyond the fault point, FIG. 5a shows an equivalent scheme for a phase-to-ground fault loop from the substation to the fault point, FIG. 5b the scheme according to FIG. 5a beyond the fault point.

DETAILED DESCRIPTION OF THE INVENTION

The basic concept of the method of the present invention is to determine the fault location as a result of checking the following set of conditions:

$Im(\underline{Z}_{ek}) \leq 0$, $k=1,2,\ldots M$ (1)

where:

$$\underline{Z}_{ek} = \begin{cases} Z_{1k}^{f} - Z_{1f} & \text{-for phase-to-phase fault-loop} \\ Z_{1k}^{f} + \underline{k}_{l} Z_{0k}^{f} - Z_{1N} & \text{-for phase-to-ground fault-loop} \end{cases}$$ (2)

$$\underline{k}_{l} = \frac{I_{pN}}{3I_{p} - I_{pN}}, \quad Z_{1N} = \frac{V_{ph}}{I_{p} - I_{pN}/3}$$ (3)

and: $\underline{V}_{ph}$ - voltage at the faulty phase, $\underline{Z}_{1f}$ - positive-sequence fault-loop impedance obtained from measurements, $\underline{I}_{p}$, $\underline{I}_{pN}$ - adequately: fault-loop and residual currents obtained from measurements.

Figure 1:
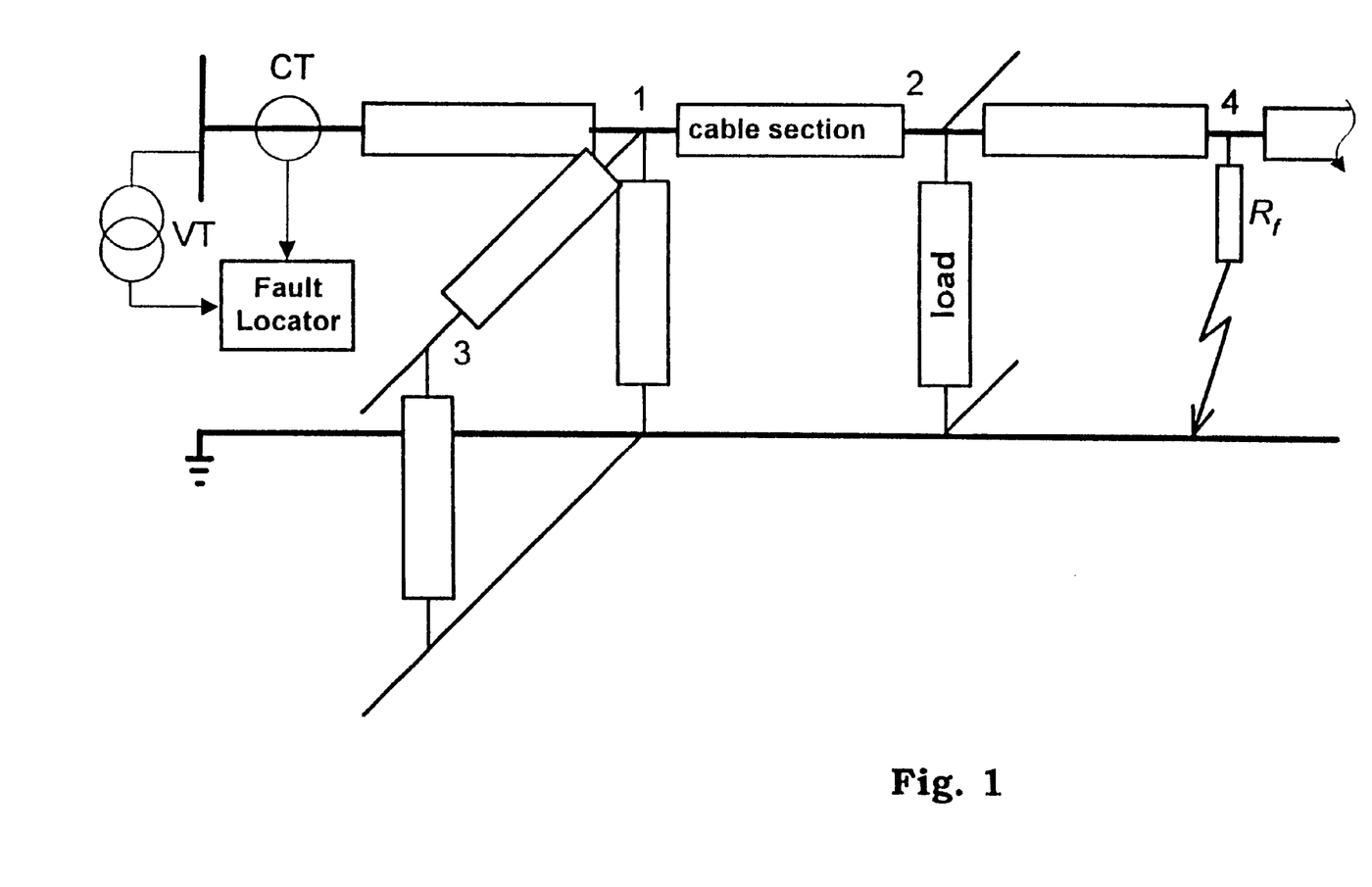
FIG. 1 shows a basic arrangement of a fault locator for a distribution network.

The fundamental assumptions considering the proposed fault locating algorithm for DN networks are summarized as follows:

1. The algorithm uses the substation voltages (three signals per substation, one signal per phase) and currents: taken from supplying transformer when centralized Fault Recorder (FR) is installed or from the faulty feeder when FRs are installed at each of the feeder. This is an advantage of the method, not a constraint. If there are FRs installed on some feeders, the data recorded by them is used for fault location (FIG. 1). If a feeder without a FR becomes faulty, the proposed method makes it possible to compute the fault impedance based only on the transformers current and busbar voltages. The adequate method for the last case is given in the Swedish Patent, No 9800741-2, "Fault Location in MV-distribution System".

2. The average values of loads along each feeder are known.

3. The electrical parameters of each section of the feeder are known.

4. At least one cycle of faulty signals is recorded.

The data mentioned in points 2 and 3, the topology of the network, comprising electrical data such as the number of lines, branches, lengths of lines between branches and the respective line impedances and of actual loads on the lines and loads at the lines, are used for steady-state network impedance calculation, and according to the algorithm used in the present invention for distance to fault calculation, one should calculate impedance $\underline{Z}_{1k}^{f}$ and $\underline{Z}_{0k}^{f}$ for steady-state condition and parameters $\underline{Z}_{1f}, \underline{k}_{l}, \underline{Z}_{1N}$ from measurements according to 1. calculate the network impedance for a given feeder for positive- and zero-sequence schemes for steady-state condition. Full set of these data includes of the following parameters:

positive ($\underline{Z}_{1L}$) and zero-sequence ($\underline{Z}_{0L}$) series impedance of all line section;

positive ($\underline{Z}_{1k}$) and zero-sequence ($\underline{Z}_{0k}$) equivalent shunt impedance for all network nodes;

positive ($\underline{Z}_{1k}^{f}$) and zero-sequence ($\underline{Z}_{0k}^{f}$) impedance as seen from the substation to all k=1 ... M network nodes (these impedances are calculated under assumption that a fault with no resistance takes place at the considered k node); the impedance $\underline{Z}_{1k}^{f}$ is then split into impedance $\underline{Z}_{1k}^{f1}$ and $\underline{Z}_{1k}^{f2}$ as in FIG. 3 with assumed coefficient 0<m≦1;

positive ($\underline{Z}_{1k}^{u}$) and zero-sequence ($\underline{Z}_{0k}^{u}$) impedance as seen from the consecutive node k to the end of the network;

All these parameters are calculated from the line parameters and values of loads with regard of the feeder configuration by use of a known method, e.g. nodal voltage equation. Reference is made to B. M. WEEDY, "Electric Power Systems". John Willey &, Sons Ltd. 1990, Chapter 7. 'Fault Analysis', pp. 251–299, for details regarding nodal voltage equation. Results of the calculation form a data set in which the node k is described by the following impedance vector: [$\underline{Z}_{1k}$ $\underline{Z}_{0k}$ $\underline{Z}_{1k}^{f1}$ $\underline{Z}_{1k}^{f2}$ $\underline{Z}_{1k}^{u}$ $\underline{Z}_{0k}^{u}$]. Moreover, each feeder section is described by two impedances: [$\underline{Z}_{1L}$ $\underline{Z}_{0L}$]. The data from the calculations are conveniently stored in a database.

The two parameters $\underline{k}_1$, $\underline{Z}_{1N}$ depend on $\underline{I}_p$, $\underline{I}_{pN}$. Again, we will consider two cases depending on the fault-loop type and place of measurements.

As a summary of the detailed description given in patent SE9800741-2, the currents $\underline{I}_p$, $\underline{I}_{pN}$ can be defined as follows:

$\underline{I}_{ph}$ - when measurements are in the feeder, $$I_p = I_{ph} - (1 - k_2) \frac{V_{ph} - V_0}{\underline{Z}_{pre}} \quad (4)$$

when measurements are at the substation, and $\underline{I}_N = \underline{I}_A + \underline{I}_B + \underline{I}_C$ - when measurements are in the feeder, $$I_{pN} = I_N - \frac{(1 - k_{2k0})V_0}{-jX_{C0}} \quad (5)$$

when measurements are at the substation.
where: $\underline{V}_0 = (\underline{V}_A + \underline{V}_B + \underline{V}_C)/3$, $$k_{zk0} = \frac{X_{C0}}{X_{C0k}} = \frac{C_{0k}}{C_{C0}}$$

$C_{0k}$ - zero-sequence capacitance of the faulty feeder,
$C_{C0}$ - zero-sequence capacitance of the whole MV network, $$k_z = \frac{S_{lk}}{S_\Sigma}$$

$\underline{S}_{1k}$ and $\underline{S}_\Sigma$ pre-fault loads of the faulty line and all the lines, respectively.

$$Z_{pre} = \frac{V_{pre}}{I_{pre}}$$

- pre-fault positive-sequence impedance at the supplying transformer,
index ph pointed to the faulty phase.

Moreover, the positive sequence fault-loop impedance $\underline{Z}_{1f}$ seen from the substation for phase-to-phase fault can be obtained from division of adequate voltage drop by difference of currents:

$$Z_{1f} = \frac{V_{pp}}{I_{pp}} \quad (6)$$

where: $\underline{V}_{pp}$ - phase-phase voltage, $\underline{I}_{pp}$ - phase-phase current, e.g. for A-B fault: $\underline{V}_{pp} = \underline{V}_A - \underline{V}_B$, $\underline{I}_{pp} = \underline{I}_A - \underline{I}_B$.

The positive sequence loop for phase-to-ground fault is obtained as follows.

For homogenous line the positive sequence fault-loop impedance seen from the substation is determined from the following relation $$Z_{1f} = \frac{V_{ph}}{I_p + k_{kN} I_{pN}} \quad (7)$$

$$k_{kN} = \frac{Z_0' - Z_1'}{3Z_1'} \quad (8)$$

$\underline{Z}_0'$, $\underline{Z}_1'$ - zero and positive sequence impedance per length of the faulted feeder, $\underline{I}_p$, $\underline{I}_{pN}$ - as in equations (4–5).

For a feeder including sections with different types of cable coefficient $k_{kN}$ can not be calculated according to equation (8) because, in general, they have different per kilometer zero- and positive sequence parameters. In this case equation (8) may be rewritten in a form:

$$k_{kN} = \frac{Z_{0k}^f - Z_{1k}^f}{3Z_{1k}^f} \quad (9)$$

where: $\underline{Z}_{0k}^f$ and $\underline{Z}_{1k}^f$ are zero- and positive-sequence impedance seen from the substation to the node k, respectively.

Substituting equation (9) into equation (7) one obtains the fault-loop impedance $$Z_{1f} = \frac{V_{ph}}{I_p + \frac{Z_{0k}^f - Z_{1k}^f}{3Z_{1k}^f} I_{pN}} \quad (10)$$

Assume that at the fault point $\underline{Z}_{1f} = \underline{Z}_{1k}^f$
After some rearrangement one obtains $$\underline{Z}_{1k}^f = \underline{Z}_{1f} = \underline{Z}_{1N} - k_I \underline{Z}_{0k}^f \quad (11)$$

where:

$$k_I = \frac{I_{pN}}{3I_p - I_{pN}}, \quad Z_{1N} = \frac{V_{ph}}{I_p - I_{pN}/3} \quad (12)$$

Relation (11) is the basis for invented method according to equations (1–3) for phase-to-ground faults. The parameters $\underline{k}_1$ and $\underline{Z}_{1N}$ can be calculated from measurements whereas $\underline{Z}_{1k}^f$ and $\underline{Z}_{0k}^f$ are actual positive-and zero-sequence impedance of a fault-loop. The last can be obtained from off-line calculation based on network parameters.

Left side of equation (11) - $\underline{Z}_{1k}^f$ - represents equivalent positive-sequence fault loop impedance seen from the substation. At the right side of equation (11) there is combination of the positive- and zero-sequence measurements available at the substation ($\underline{Z}_{1N}$, $\underline{k}_1$) and zero-sequence impedance of the network from the substation to the fault point $\underline{Z}_{0k}^{f}$.

Having the network impedance $\underline{Z}_{1k}^{f}$ and $\underline{Z}_{0k}^{f}$ for steady-state condition, and fault-loop parameters: $\underline{Z}_{1f}$, $\underline{k}_1$, $\underline{Z}_{1N}$ given from measurements according to the equations (2) and (3) with respect to the above relations it is possible to utilise the criterion (1) for distance to fault calculation.

The final distance to fault will be chosen when the condition as in (1) is fulfilled.

ALGORITHM FOR DISTANCE TO FAULT ESTIMATION

Two different algorithms are used depending of the fault-loop type: phase-to-phase fault loop and phase-to-ground fault loop.

A. Phase-to-phase fault

Figure 2:
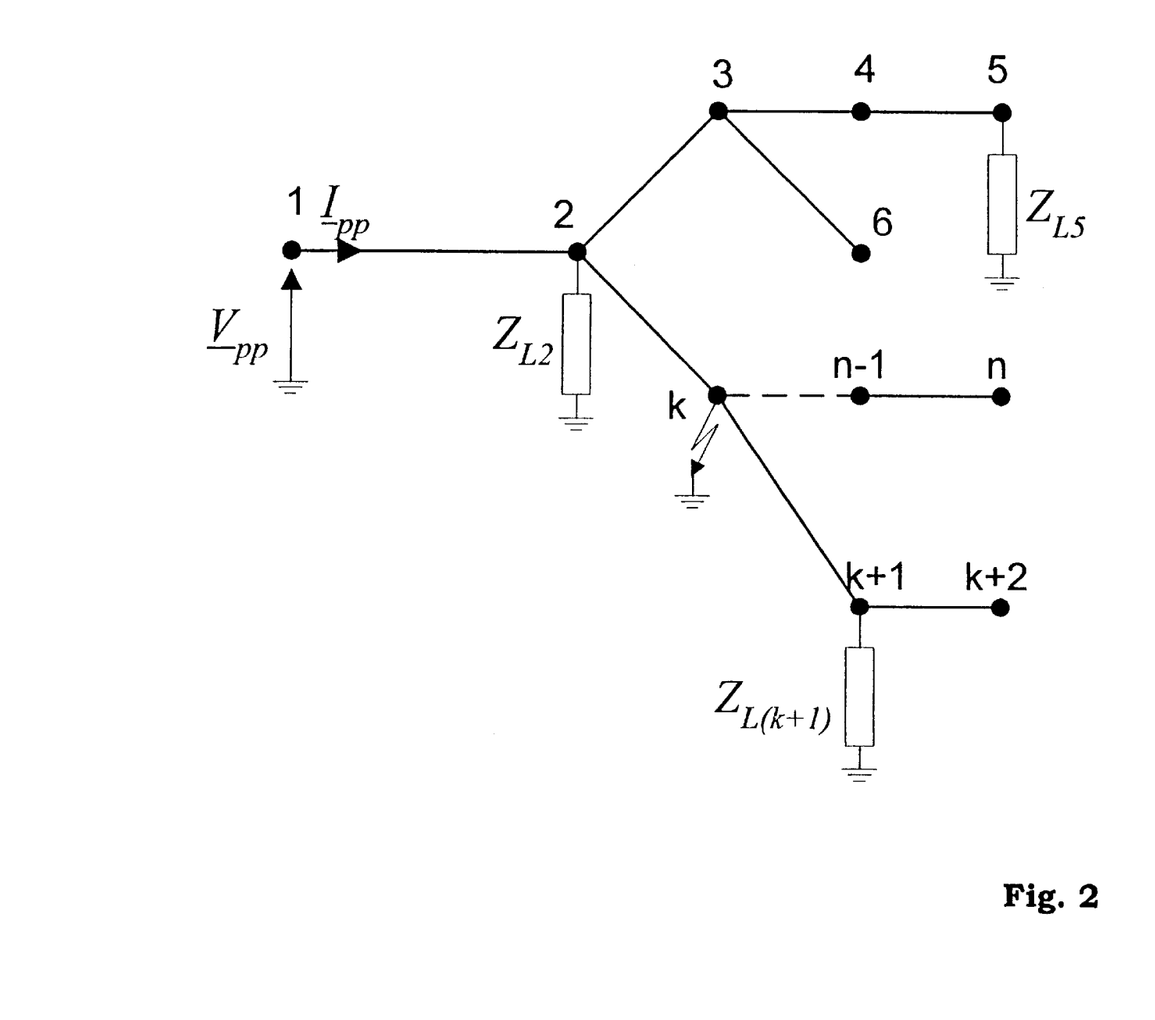
FIG. 2 shows a scheme of a network for a phase-to-phase fault at node k.

Consider the phase-to-phase fault at node k of the network as in FIG. 2. It is assumed that the impedance $\underline{Z}_{1k}^{f}$ (positive-sequence network impedance as seen from the substation under assumption that the fault with no resistance occurs at the node k) is known from steady-state calculation and $\underline{Z}_{1f}$ is obtained from measurement according to (6).

Figure 3:
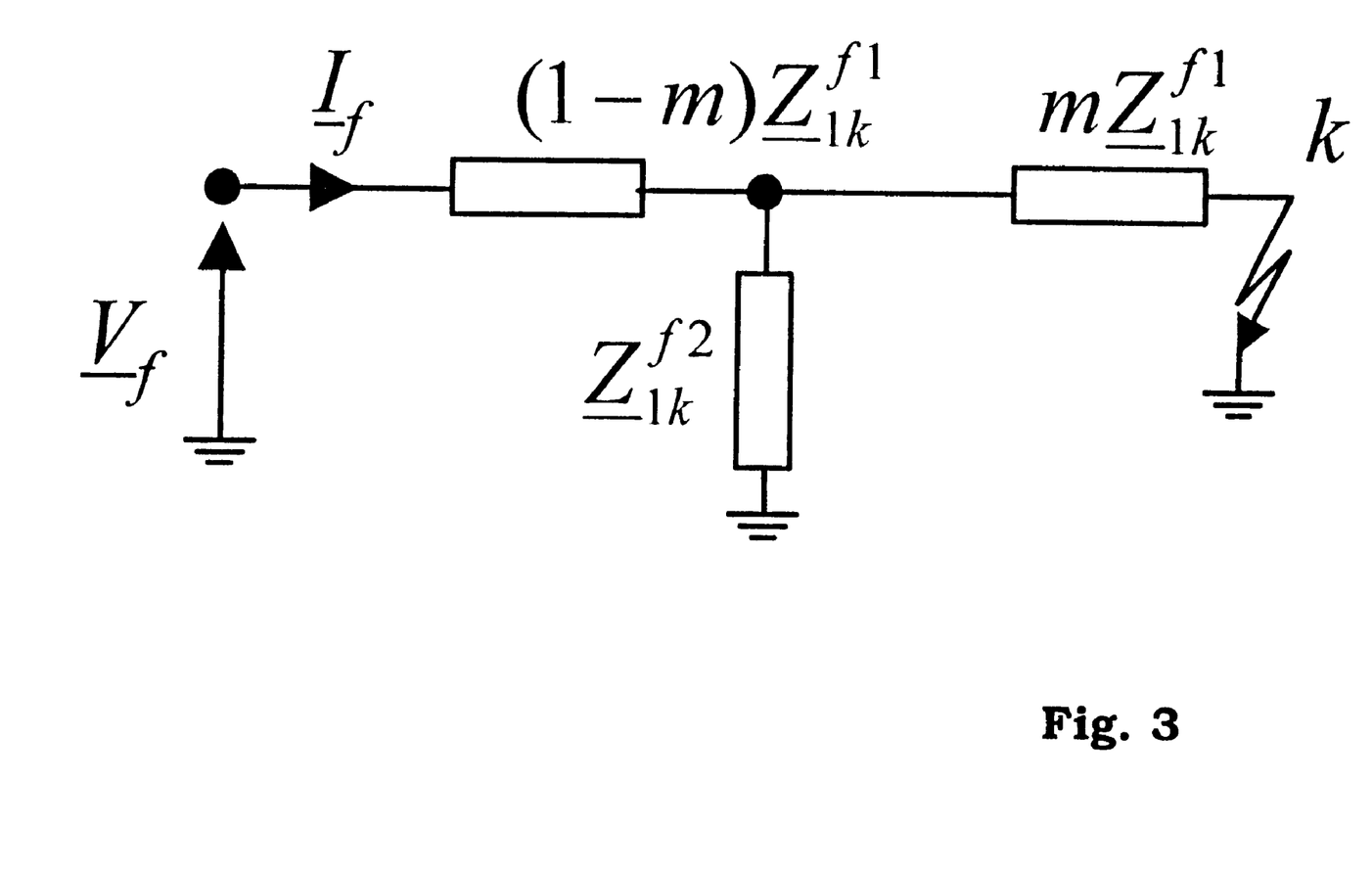
FIG. 3 shows an equivalent scheme for feeder impedance calculation.

For further analysis the fault loop seen from the substation is represented by an equivalent scheme as in FIG. 3. The following condition is fulfilled for this scheme:

$$Z_{1k}^{f} = (1-m)Z_{1k}^{f1} + \frac{mZ_{1k}^{f1}Z_{1k}^{f2}}{mZ_{1k}^{f1} + Z_{1k}^{f2}} \tag{13}$$

The separate impedance in equation (13) can be easily determined from the known impedance $\underline{Z}_{1k}^{f}$ by choosing of the parameter m (0<m≦1).

Figure 4:
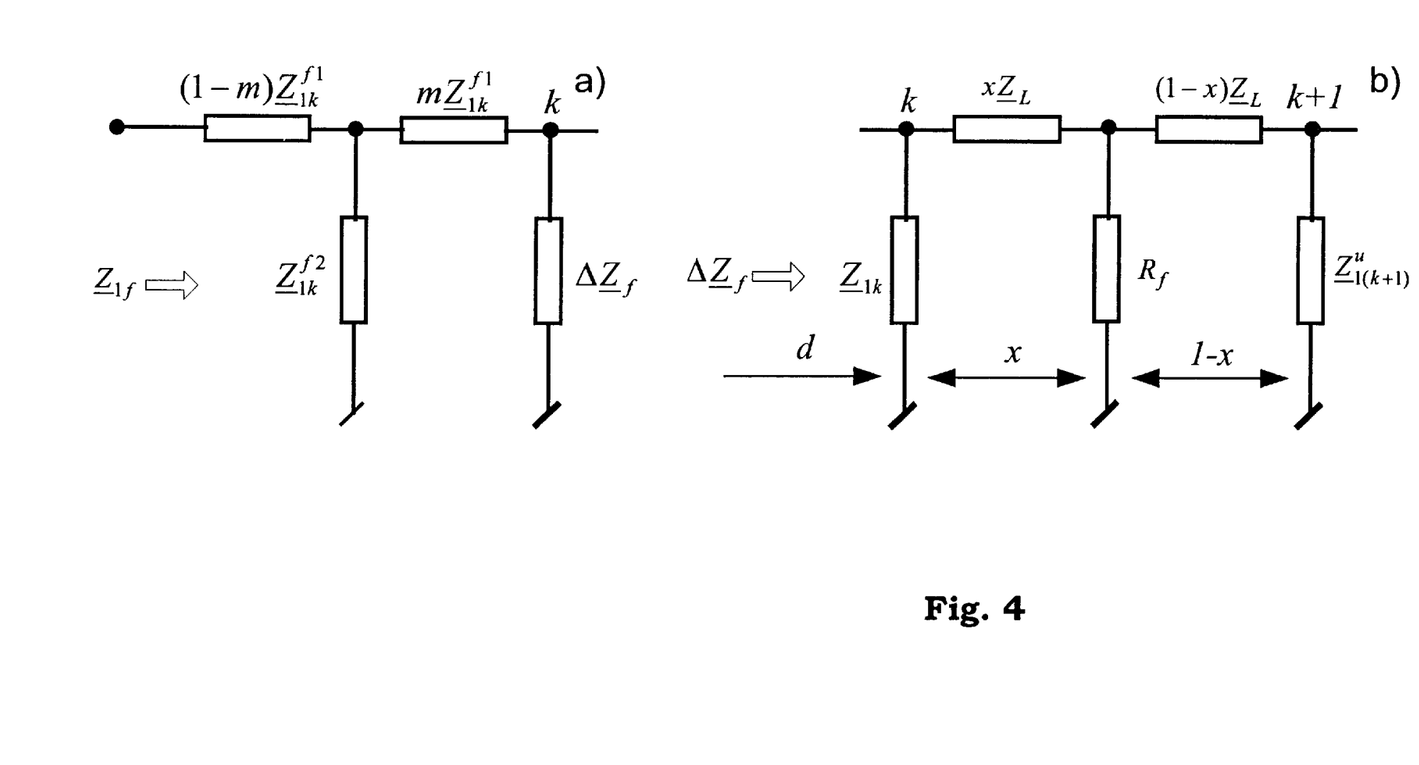

Representation of the impedance $\underline{Z}_{1k}^{f}$ in a form as in FIG. 3 provides a possibility to include the fault resistance in a fault-loop as shown in FIG. 4a. The residual impedance $\Delta Z_f$ represents the equivalent impedance involved in fault-loop due to the fault resistance $R_f$ if the fault occurs at node k or behind them. The equivalent scheme for representation of the impedance $\Delta Z_f$ is presented in FIG. 4b. Here:

$\underline{Z}_{1k}$ - equivalent shunt impedance at node k, $\underline{Z}_L$ - series impedance of the cable section between nodes k, k+1, $\underline{Z}_{1(k+1)}^{u}$ - equivalent impedance of the network seen from the node k+1 to the end of the feeder.

The impedance $\underline{Z}_{1(k+1)}^{u}$ should be also calculated in steady-state condition for all network nodes and stored in a database.

The distance to fault $d_f$ [m] is determined as a sum of distance d [m] from substation to node k (FIG. 4b) and distance $xl_k$ [m] inside a given section:

$$d_f = d + xl_k \tag{14}$$

where $l_k$ is section length.

The algorithm for distance x calculation is derived as follows:

1. The fault-loop impedance $\underline{Z}_{1f}$ measured at the substation meets the following relation (FIG. 4a)

$$Z_{1f} = (1-m)Z_{1k}^{f1} + \frac{(mZ_{1k}^{f1} + \Delta Z_f)Z_{1k}^{f2}}{mZ_{1k}^{f1} + \Delta Z_f + Z_{1k}^{f2}} \tag{15}$$

2. After rearranging of (15) the value of residual impedance can be obtained $$\Delta Z_f = \frac{(Z_{1k}^{f1} - Z_{1f})(mZ_{1k}^{f1} + Z_{1k}^{f2}) - (mZ_{1k}^{f1})^2}{mZ_{1k}^{f1} - Z_{1k}^{f2} - (Z_{1k}^{f1} - Z_{1f})} \tag{16}$$

3. The impedance $\Delta \underline{Z}_f$ represents the scheme seen from the node k to the fault place what can be determined as $$\Delta Z_f = \frac{Z_{1k}\left(xZ_L + \frac{R_f((1-x)Z_L + Z_{1(k+1)}^{u})}{R_f + (1-x)Z_L + Z_{1(k+1)}^{u}}\right)}{Z_{1k} + xZ_L + \frac{R_f((1-x)Z_L + Z_{1(k+1)}^{u})}{R_f + (1-x)Z_L + Z_{1(k+1)}^{u}}} \tag{17}$$

4. Right sides of equations (16) and (17) should be equal, which leads to determination of unknown fault resistance $$R_f = x^2 \frac{Z_L^2(\Delta Z_f - Z_{1k})}{M} - xZ_L - \frac{\Delta Z_f Z_{1k}(Z_L + Z_{1(k+1)}^{u})}{M} \tag{18}$$

where $M = (\Delta Z_f - Z_{1k})(Z_L + Z_{1(k+1)}^{u}) - \Delta Z_f Z_{1k}$.

5. Value of x can be obtained from (18) under condition that the fault resistance takes real value $$\text{Im}(R_f) = \tag{19}$$

$$x^2 \text{Im}\left(\frac{Z_L^2(\Delta Z_f - Z_{1k})}{M}\right) - x\text{Im}(Z_L) - \text{Im}\left(\frac{\Delta Z_f Z_{1k}(Z_L + Z_{1(k+1)}^{u})}{M}\right) = 0$$

After rearranging one obtains $$x_1 = \frac{\text{Im}(Z_L) + \sqrt{p}}{2\text{Im}\left(\frac{Z_L^2(\Delta Z_f - Z_{1k})}{M}\right)}, \quad x_2 = \frac{\text{Im}(Z_L) - \sqrt{p}}{2\text{Im}\left(\frac{Z_L^2(\Delta Z_f - Z_{1k})}{M}\right)}, \tag{20}$$

where $p = \text{Im}^2(Z_L) + 4\text{Im}\left(\frac{Z_L^2(\Delta Z_f - Z_{1k})}{M}\right)\text{Im}\left(\frac{\Delta Z_f Z_{1k}(Z_L + Z_{1(k+1)}^{u})}{M}\right)$.

First root of (20) takes imaginary value so, finally, distance to a fault is determined from $$x = \frac{\text{Im}(Z_L) - \sqrt{p}}{2\text{Im}\left(\frac{Z_L^2(\Delta Z_f - Z_{1k})}{M}\right)} \tag{21}$$

The distance to fault is then calculated according to equation (14).

B. Phase-to-ground fault

Figure 5:
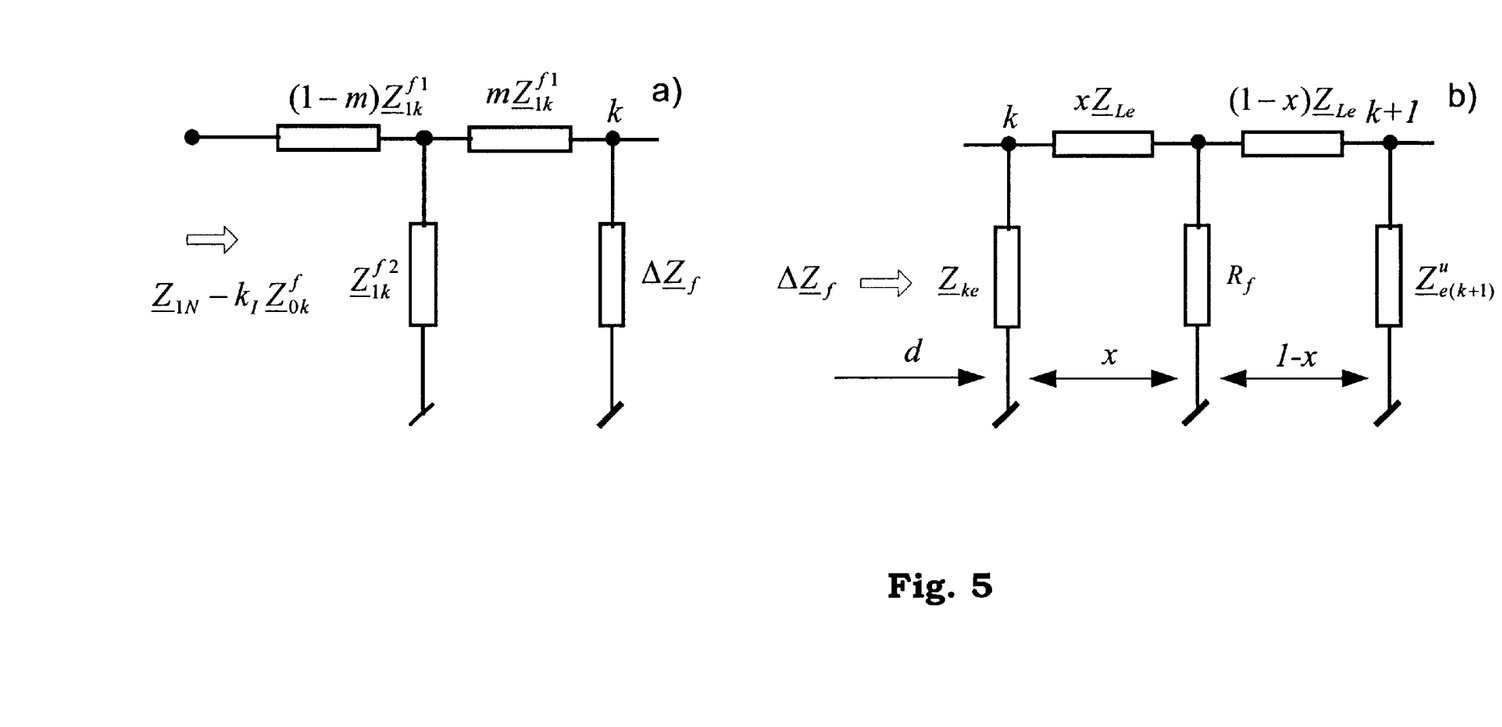

Equivalent scheme of the fault-loop (FIG. 5) is similar as for phase-to-phase case. Instead of $\underline{Z}_{1f}$ now the impedance form of equation (10) is used. Taking this into consideration, the algorithm for distance x [p.u.] to the fault at section k, k+1 is derived as follows:

1. The fault-loop impedance $\underline{Z}_{1k}^{f} = \underline{Z}_{1N} - \underline{k}_1 \underline{Z}_{0k}^{f}$ measured at the substation meets the following relation (FIG. 5a)

$$Z_{1k}^f = Z_{1N} - k_I Z_{0k}^f = (1-m)Z_{1k}^{f1} + \frac{(mZ_{1k}^{f1} + \Delta Z_f)Z_{1k}^{f2}}{mZ_{1k}^{f1} + \Delta Z_f + Z_{1k}^{f2}} \quad (22)$$

2. After rearranging of (22) the value of residual impedance can be obtained $$\Delta Z_f = \frac{(Z_{1k}^{f1} - Z_{1f})(mZ_{1k}^{f1} + Z_{1k}^{f2}) - (mZ_{1k}^{f1})^2}{mZ_{1k}^{f1} - Z_{1k}^{f2} - (Z_{1k}^{f1} - Z_{1f})} \quad (23)$$

3. The impedance $\Delta Z_f$ represents the scheme seen from the node k to the fault place what can be determined as (FIG. 5b)

$$\Delta Z_f = \frac{Z_{ke}\left(xZ_{Le} + \frac{R_f(1-x)Z_{Le} + Z_{e(k+1)}^u}{R_f + (1-x)Z_{Le} + Z_{e(k+1)}^u}\right)}{Z_{ke} + xZ_{Le} + \frac{R_f((1-x)Z_{Le} + Z_{e(k+1)}^u)}{R_f + (1-x)Z_{Le} + Z_{e(k+1)}^u}} \quad (24)$$

where index e is related to the equivalent impedance in scheme on FIG. 5b.

The equivalent impedance is calculated from positive- and zero-sequence impedance of the particular element according to the following relations:

$$Z_{Le} = \frac{2Z_{1L} + Z_{0L}}{3}, \quad (25)$$

$$Z_{ke} = \frac{2Z_{1k} + Z_{0k}}{3},$$

$$Z_e^u = \frac{2Z_1^u + Z_0^u}{3}$$

where indices 0 and 1 refer to zero- and positive-sequence impedance, respectively.

4. Right sides of equations (23) and (24) should be equal which leads to determination of unknown fault resistance $$R_f = x^2 \frac{Z_{Le}^2(\Delta Z_f - Z_{ke})}{M} - xZ_{Le} - \frac{\Delta Z_f Z_{ke}(Z_{Le} + Z_{e(k+1)}^u)}{M} \quad (26)$$

where $M = (\Delta Z_f - Z_{ke})(Z_{Le} + Z_{e(k+1)}^u) - \Delta Z_f Z_{ke}$.

5. Value of x can be obtained from equation (26) under condition that the fault resistance takes a real value $$\text{Im}(R_f) = x^2 \text{Im}\left(\frac{Z_{Le}^2(\Delta Z_f - Z_{ke})}{M}\right) - \quad (27)$$

$$x\text{Im}(Z_{Le}) - \text{Im}\left(\frac{\Delta Z_f Z_{ke}(Z_{Le} + Z_{e(k+1)}^u)}{M}\right) = 0$$

Under the same conditions as for phase-to-phase fault one obtains $$x = \frac{\text{Im}(Z_{Le}) - \sqrt{p}}{2\text{Im}\left(\frac{Z_{Le}^2(\Delta Z_f - Z_{ke})}{M}\right)} \text{ where} \quad (28)$$

-continued $$p = \text{Im}^2(Z_{Le}) + 4\text{Im}\left(\frac{Z_{Le}^2(\Delta Z_f - Z_{ke})}{M}\right)\text{Im}\left(\frac{\Delta Z_f Z_{ke}(Z_{Le} + Z_{e(k+1)}^u)}{M}\right).$$

The distance to fault is then calculated according to equation (14).

Figure 6:
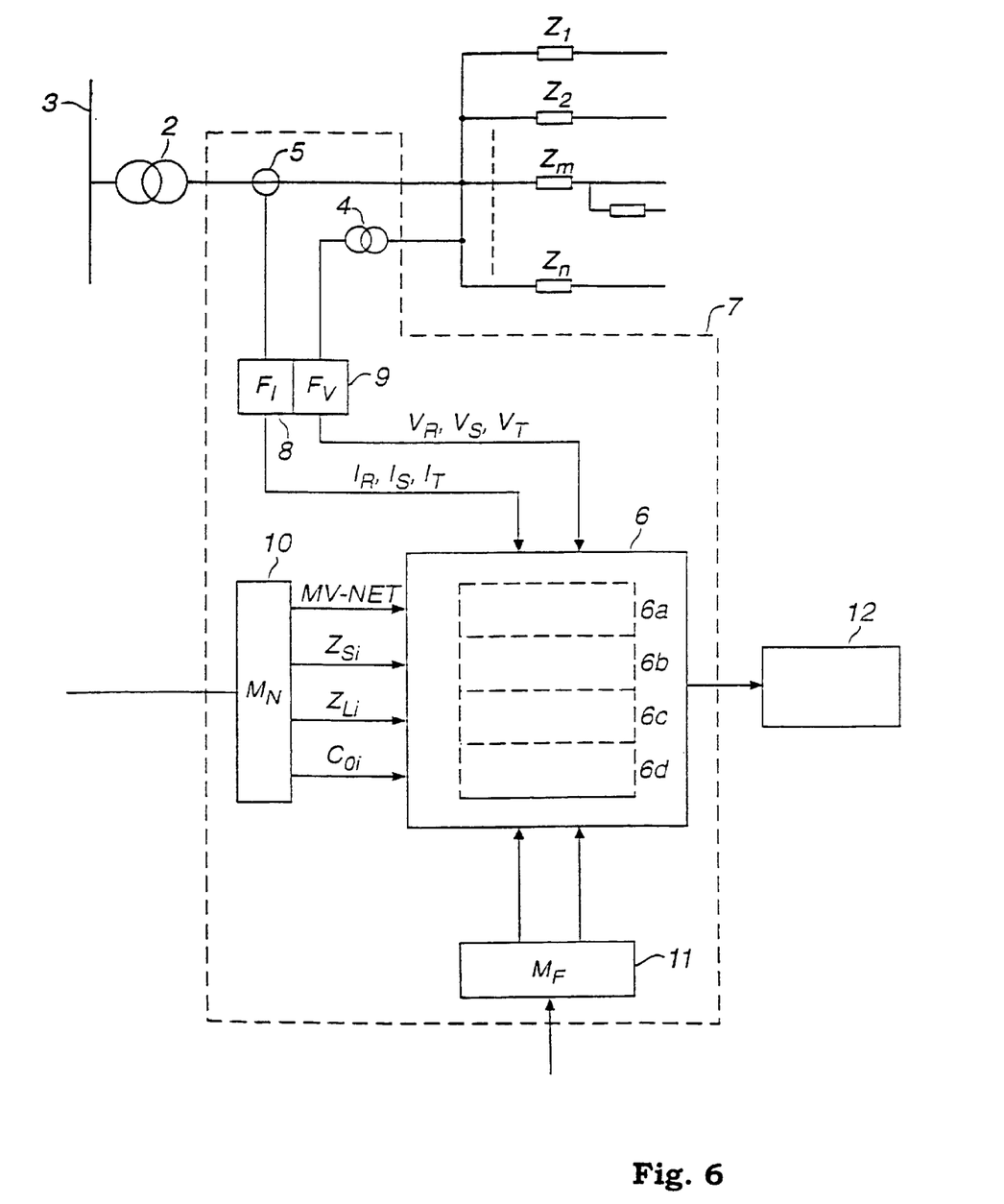
FIG. 6 shows an embodiment of a device according to the invention for a fault location on one of the lines included in a network.

An example of a device according to the invention for fault location on one of the lines included in a distribution network is clear from FIG. 6 and comprises:

a fault locator 6, voltage and current measuring devices 4 and 5, with filters $F_I$, 8 and $F_V$, 9 for continuously inputting to the fault locator measured values of current and voltage values, measured at an MV station, for all the lines included in the network, a unit $M_N$, 10, for inputting MV network data to the fault locator, and a unit $M_F$, 11, for inputting information about the type of fault and about which line has become faulty, after a fault has occurred.

The fault locator 6 comprises:

a memory, 6a, for storing consecutive sequences of measured input data which enable determination of measured values of voltage and current immediately prior to and after a fault has occurred, and a memory for storing input network data, a unit $E_F$, 6b, for receiving information about the type of fault and about which line has become faulty, calculating methods, 6c, for calculating, on the basis of input data, the distance from the MV station to the site of the fault, a unit $E_A$, 6d, for supplying a value of the calculated distance to fault.

The network data which, via the unit $M_N$, 10, are to be input into the fault locator comprise:

information about the configuration and topology of the MV network, that is, how network, lines and branches are connected to the MV network, information about the length and impedance of the line sections, information about the load impedance in all the branches, information about the positive-sequence capacitance of all the lines to ground.

The network data which, after a fault has occurred, are to be input into the fault locator via the unit $M_F$, 11 comprise information about the type of fault, that is, if it is a phase-to-phase fault or if it is a phase-to-ground fault, information about which line has become faulty.

The information about the type of fault and which line has become faulty is obtained from a superordinate protection and expert system.

When a distance to fault from the MV station has been calculated, this is presented via the unit $E_A$, 6d, for example on a visual display unit 12.

A device according to the invention for fault location on one of the lines included in DN may be designed in a plurality of ways similar to that shown in FIG. 6. Thus, for example, the filters 8 and 9 for filtering measured data for current and voltage and the input units 10 and 11 for network data and fault information may be more or less integrated into the fault locator 6. The device also comprises one or more micro computers. The micro processor (or processors) comprises a central processing unit CPU performing the steps of the method according to the invention. This is performed with the aid of a dedicated computer program, which is stored in the program memory. It is to be understood that the computer program may also be run on a general purpose industrial computer instead of a specially adapted computer.

The software includes computer program code elements or software code portions that make the computer perform the method using equations, algorithms, data and calculations previously described. A part of the program may be stored in a processor as above, but also in a ROM, RAM, PROM or EPROM chip or similar. The program in part or in whole may also be stored on, or in, other suitable computer readable medium such as a magnetic disk, CD-ROM or DVD disk, hard disk, magneto-optical memory storage means, in volatile memory, in flash memory, as firmware, or stored on a data server.

The method proposed in this invention realises the procedure for the fault location in distribution networks in the following steps:

1. For a given feeder calculate the network impedance for positive- and zero-sequence schemes for steady-state condition and store them into database. Full set of these data includes the following parameters:
   positive ($\underline{Z}_{1L}$) and zero-sequence ($\underline{Z}_{0L}$) series impedance of all line section;
   positive ($\underline{Z}_{1k}$) and zero-sequence ($\underline{Z}_{0k}$) equivalent shunt impedance for all network nodes;
   positive ($\underline{Z}_{1k}^f$) and zero-sequence ($\underline{Z}_{0k}^f$) impedance as seen from the substation to all k=1 . . . M network nodes (these impedance are calculated under assumption that a fault with no resistance take place at the considered k node); the impedance $\underline{Z}_{1k}^f$ is then split into impedance $\underline{Z}_{1k}^{f1}$ and $\underline{Z}_{1k}^{f2}$ as in FIG. 3 with assumed coefficient $0<m\leq 1$;
   positive ($\underline{Z}_{1k}''$) and zero-sequence ($\underline{Z}_{0k}''$) impedance as seen from the consecutive node k to the end of the network;

All these parameters are calculated from the cable or line parameters and value of loads with regard of the feeder configuration by using of known method, e.g. nodal voltage equation. Results of the calculation form a data set in which the node k is described by the following impedance vector: [$\underline{Z}_{1k}$ $\underline{Z}_{0k}$ $\underline{Z}_{1k}^{f1}$ $\underline{Z}_{1k}^{f2}$ $\underline{Z}_{1k}''$ $\underline{Z}_{0k}''$]. Moreover, each feeder section is described by two impedances: [$\underline{Z}_{1L}$ $\underline{Z}_{0L}$].

After the fault detection the procedure depends on the type of fault. For phase-to-phase fault the following steps are realized:

2. The impedance $\underline{Z}_{1f}$ is calculated according to equation (6);
3. Going through the consecutive nodes the residual impedance $\Delta\underline{Z}_f$ is calculated as in equation (16) and next the distance x according to equation (21). This step is continued until x<1 and then full distance is determined according to equation (14).

For phase-to-ground fault the following steps are realized:

4. The currents $\underline{I}_p$ and $\underline{I}_{pN}$ are calculated according to equations (4–5) - depending on the place of measurement;
5. Parameters $\underline{k}_1$, $\underline{Z}_{1N}$ and impedance $\underline{Z}_{1f}$ are calculated as in equations (10–12);
6. Going through the consecutive nodes the residual impedance $\Delta\underline{Z}_f$ is calculated as in equation (24) and next the distance x according to equation (28). This step is continued until x<1 and then full distance is determined according to equation (14).

It is to be understood that the embodiments described above and shown on the drawings are to be regarded as non-limiting examples of the present invention and that it is defined by the appended patent claims.

What is claimed is:

1. Method for location of a fault which has occurred on one of a plurality of lines in a power distribution network where the location is performed with the aid of measured values of the common supply voltage of the said plurality of lines and the currents of the said plurality of lines after the occurrence of a fault; calculating the equivalent positive-sequence impedance $\underline{Z}_{1k}^f$ and zero-sequence impedance $\underline{Z}_{0k}^f$ of the network in a pre-fault steady state for all M nodes based on knowledge of the configuration and topology of the network, and obtaining, via a superordinate protection system, which of the said plurality type of lines has become faulty and which fault has occurred, characterised by calculating the equivalent impedance $\underline{Z}_{ek}$ using a fault loop calculation depending on the fault type as $$\underline{Z}_{ek} = \begin{cases} Z_{1k}^f - Z_{1f} & \text{- for phase-to-phase fault-loop} \\ Z_{1k}^f + k_I Z_{0k}^f - Z_{1N} & \text{- for phase-to-ground fault-loop} \end{cases}$$

where $$k_I = \frac{I_{pN}}{3I_p - I_{pN}}, \quad Z_{1N} = \frac{V_{ph}}{I_p - I_{pN}/3},$$

and: $\underline{V}_h$ - voltage at the faulty phase, $\underline{Z}_{1f}$ - positive-sequence fault-loop impedance obtained from measurements, $\underline{I}_p$, $\underline{I}_{pN}$ - adequately: fault-loop and residual currents obtained from measurements, and checking if $\text{Im}(\underline{Z}_{ek})\geq 0$, k=1,2, . . . M wherein, upon being fulfilled, the distance to fault is chosen.

2. Method according to claim 1, characterised in that $\underline{I}_p$, $\underline{I}_{pN}$ are defined as $\underline{I}_{ph}$ - when measurements are in the feeder, $$I_p = I_{ph} - (1 - \underline{k}_z)\frac{V_{ph} - V_0}{Z_{pre}}$$

when measurements are at the substation, and
$\underline{I}_N = \underline{I}_A + \underline{I}_B + \underline{I}_C$ when measurements are in the feeder, $$I_{pN} \quad I_N - \frac{(1 - k_{zk0})V_0}{-jX_{C0}}$$

when measurements are at the substation,
where: $\underline{V}_0 = (\underline{V}_A + \underline{V}_B + \underline{V}_C)/3$, $$k_{zk0} = \frac{X_{C0}}{X_{C0k}} = \frac{C_{0k}}{C_{C0}}$$

$C_{0k}$ - zero-sequence capacitance of the faulty feeder,
$C_{C0}$ - zero-sequence capacitance of the whole MV network, $$k_z = \frac{S_{lk}}{S_{\Sigma}}$$

$\underline{S}_{1k}$ and $\underline{S}_{\Sigma}$ pre-fault loads of the faulty line and all the lines, respectively.

3. Method according to claim 2 for a phase-to-ground fault, characterised in calculating impedance $\underline{Z}_{1f}$ according to $$Z_{1f} = \frac{V_{ph}}{I_p + \frac{Z_{0k}^f - Z_{1k}^f}{3Z_{1k}^f} I_{pN}},$$

assuming $\underline{Z}_{1f} = \underline{Z}_{1k}^f$ at the fault point and rearranging: $\underline{Z}_{1f} = \underline{Z}\underline{Z}_{1N} - \underline{k}_1 \underline{Z}_{0k}^f$
where:

$$\underline{k}_I = \frac{I_{pN}}{3I_p - I_{pN}}, \quad Z_{1N} = \frac{V_{ph}}{I_p - I_{pN}/3},$$

calculating the residual impedance going through consecutive nodes as $$\Delta Z_f = \frac{Z_{ke}\left(xZ_{Le} + \frac{R_f((1-x)Z_{Le} + Z_{e(k+1)}^u)}{R_f + (1-x)Z_{Le} + Z_{e(k+1)}^u}\right)}{Z_{ke} + xZ_{Le} + \frac{R_f((1-x)Z_{Le} + Z_{e(k+1)}^u)}{R_f + (1-x)Z_{Le} + Z_{e(k+1)}^u}},$$

calculating distance x from node to fault as $$x = \frac{Im(Z_{Le}) - \sqrt{p}}{2\, Im\left(\frac{Z_{Le}^2(\Delta Z_f - Z_{ke})}{M}\right)}$$

and continuing until x<1.

4. Method according to claim 3, characterised in determining the distance to fault $d_f$ as
$d_f = d + xl_k$
where d is distance from substation to node k and distance and $l_k$ is section length.

5. Method according to claim 2 for a phase-to-phase fault, characterised in calculating impedance $\underline{Z}_{1f}$ according to $$Z_{1f} = \frac{V_{pp}}{I_{pp}}$$

where: $\underline{V}_{pp}$ - phase-phase voltage, $\underline{I}_{pp}$ - phase-phase current, e.g. for A-B fault: $\underline{V}_{pp} = \underline{V}_A - \underline{V}_B$, $\underline{I}_{pp} = \underline{I}_A - \underline{I}_B$, calculating the residual impedance going through consecutive nodes as $$\Delta Z_f = \frac{Z_{1k}\left(xZ_L + \frac{R_f((1-x)Z_L + Z_{1(k+1)}^u)}{R_f + (1-x)Z_L + Z_{1(k+1)}^u}\right)}{Z_{1k} + xZ_L + \frac{R_f((1-x)Z_L + Z_{1(k+1)}^u)}{R_f + (1-x)Z_L + Z_{1(k+1)}^u}},$$

calculating distance x from node to fault as $$x = \frac{Im(Z_L) - \sqrt{p}}{2\, Im\left(\frac{Z_L^2(\Delta Z_f - Z_{1k})}{M}\right)},$$

and continuing until x<1.

6. Method according to claim 5, characterised in determining the distance to fault $d_f$ as $d_f = d + xl_k$ where d is distance from substation to node k and distance and $l_k$ is section length.

7. Device (6) for location of a fault which has occurred on one of a plurality of lines in a power distribution network comprising means for measuring values of the common supply voltage of the plurality of lines and the currents of the plurality lines before and after the occurrence of a fault; means (10) for calculating the equivalent positive-sequence impedance $\underline{Z}_{1k}^f$ and zero-sequence impedance $\underline{Z}_{0k}^f$ of the network in a pre-fault steady state for all M nodes; information storage means (10) containing information regarding the configuration and topology of the network; which device is connected to a superordinate protection system, for obtaining information regarding which of the said plurality of lines has become faulty and which type of fault has occurred, characterised in means (6c) for calculating the equivalent impedance $\underline{Z}_{ek}$ using fault loop calculation depending on the fault type as $$Z_{ek} = \begin{cases} Z_{1k}^f - Z_{1f} & \text{-for phase-to-phase fault-loop} \\ Z_{1k}^f + \underline{k}_I Z_{0k}^f - Z_{1N} & \text{-for phase-to-ground fault-loop} \end{cases}$$

where $$\underline{k}_I = \frac{I_{pN}}{3I_p - I_{pN}}, \quad Z_{1N} = \frac{V_{ph}}{I_p - I_{pN}/3},$$

and: $\underline{V}_{ph}$ - voltage at the faulty phase, $\underline{Z}_{1f}$ - positive-sequence fault-loop impedance obtained from measurements, $\underline{I}_p$, $\underline{I}_{pN}$ - adequately: fault-loop and residual currents obtained from measurements, and checking if Im($\underline{Z}_{ek}$)≧0, k=1,2, . . . M wherein, upon being fulfilled, the distance to fault is chosen.

8. Device according to claim 7, characterised in means for defining $\underline{I}_p$, $\underline{I}_{pN}$ as $\underline{I}_{ph}$ - when measurements are in the feeder, $$I_p = I_{ph} - (1 - \underline{k}_z)\frac{V_{ph} - V_0}{Z_{pre}}$$

when measurements are at the substation, and $\underline{I}_N = \underline{I}_A + \underline{I}_B + \underline{I}_C$ when measurements are in the feeder, $$I_{pN} \quad I_N - \frac{(1 - k_{zk0})V_0}{-jX_{C0}}$$

when measurements are at the substation, where: $\underline{V}_0 = (\underline{V}_A + \underline{V}_B + \underline{V}_C)/3$, $$k_{zk0} = \frac{X_{C0}}{X_{C0k}} = \frac{C_{0k}}{C_{C0}}$$

$C_{0k}$ - zero-sequence capacitance of the faulty feeder,
$C_{C0}$ - zero-sequence capacitance of the whole MV network, $$k_z = \frac{\underline{S}_{lk}}{\underline{S}_\Sigma}$$

$\underline{S}_{1k}$ and $\underline{S}_\Sigma$ pre-fault loads of the faulty line and all the lines, respectively.

9. Device according to claim 8 for a phase-to-ground fault, characterised in means for calculating impedance $\underline{Z}_{1f}$ according to $$Z_{1f} = \frac{V_{ph}}{I_p + \frac{Z_{0k}^f - Z_{1k}^f}{3Z_{1k}^f} I_{pN}},$$

assuming $\underline{Z}_{1f} = \underline{Z}_{1k}^f$ at the fault point and rearranging:

$\underline{Z}_{1f} = \underline{Z}_{1N} - \underline{k}_1 \underline{Z}_{0k}^f$ where:

$$\underline{k}_l = \frac{I_{pN}}{3I_p - I_{pN}}, Z_{1N} = \frac{V_{ph}}{I_p - I_{pN}/3},$$

means for calculating the residual impedance going through consecutive nodes as $$\Delta Z_f = \frac{Z_{ke}\left(xZ_{Le} + \frac{R_f((1-x)Z_{Le} + Z_{e(k+1)}^u)}{R_f + (1-x)Z_{Le} + Z_{e(k+1)}^u}\right)}{Z_{ke} + xZ_{Le} + \frac{R_f((1-x)Z_{Le} + Z_{e(k+1)}^u)}{R_f + (1-x)Z_{Le} + Z_{e(k+1)}^u}},$$

means for calculating distance x from node to fault as $$x = \frac{Im(\underline{Z}_{Le}) - \sqrt{p}}{2 Im\left(\frac{Z_{Le}^2(\Delta Z_f - Z_{ke})}{M}\right)},$$

and continuing until x<1.

10. Device according to claim 9, characterised in means for determining the distance to fault $d_f$ as $d_f = d + x l_k$ where d is distance from substation to node k and distance and $l_k$ is section length.

11. Device according to claim 8 for a phase-to-phase fault, characterised in means for calculating impedance $\underline{Z}_{1f}$ according to $$Z_{1f} = \frac{V_{pp}}{I_{pp}}$$

where: $\underline{V}_{pp}$ - phase-phase voltage, $\underline{I}_{pp}$ - phase-phase current, e.g. for A-B fault: $\underline{V}_{pp} = \underline{V}_A - \underline{V}_B$, $\underline{I}_{pp} = \underline{I}_A - \underline{I}_B$, means for calculating the residual impedance going through consecutive nodes as $$\Delta Z_f = \frac{Z_{1k}\left(xZ_L + \frac{R_f((1-x)\underline{Z}_L + Z_{1(k+1)}^u)}{R_f + (1-x)Z_L + Z_{1(k+1)}^u}\right)}{Z_{1k} + xZ_L + \frac{R_f((1-x)Z_L + Z_{1(k+1)}^u)}{R_f + (1-x)Z_L + Z_{1(k+1)}^u}},$$

means for calculating distance x from node to fault as $$x = \frac{Im(\underline{Z}_L) - \sqrt{p}}{2 Im\left(\frac{Z_L^2(\Delta Z_f - Z_{1k})}{M}\right)},$$

and continuing until x<1.

12. Device according to claim 11, characterised in means for determining the distance to fault $d_f$ as $d_f = d + x l_k$ where d is distance from substation to node k and distance and $l_k$ is section length.

13. Use of device according to claim 8 for determining the distance to a fault in a distribution network.

14. Use of a device according to claim 7 for determining the distance to a fault in a distribution network.

15. Computer program product comprising computer code means and/or software code portions for making a computer perform a method based on; measuring values of the common supply voltage of a plurality of lines and the currents of the said plurality of lines after the occurrence of a fault in a distribution network; calculating the equivalent positive-sequence impedance $\underline{Z}_{1k}^f$ and zero-sequence impedance $\underline{Z}_{0k}^f$ of the network in a pre-fault steady state for all M nodes based on knowledge of the configuration and topology of the network and of electrical data such as the number of lines, branches, lengths of lines between branches and the respective line impedances and of actual loads on the lines and loads at the lines, and; obtaining via a superordinate protection system, which line has become faulty and which type of fault has occurred, and performing the further steps of:

calculating the equivalent impedance $\underline{Z}_{ek}$ using fault loop calculation depending on the fault type as $$\underline{Z}_{ek} = \begin{cases} Z_{1k}^f - Z_{1f} & \text{- for phase-to-phase fault-loop} \\ Z_{1k}^f + \underline{k}_l Z_{0k}^f - Z_{1N} & \text{- for phase-to-ground fault-loop} \end{cases}$$

-for phase - to - phase fault - loop

-for phase- to -ground fault -loop where $$\underline{k}_l = \frac{I_{pN}}{3I_p - I_{pN}}, Z_{1N} = \frac{V_{ph}}{I_p - I_{pN}/3},$$

and: $\underline{V}_{ph}$ - voltage at the faulty phase, $\underline{Z}_{lf}$ - positive-sequence fault-loop impedance obtained from measurements, $\underline{I}_p$, $\underline{I}_{pN}$ - adequately: fault-loop and residual currents obtained from measurements, and checking if $Im(\underline{Z}_{ek}) \geq 0$, k=1,2, ... M wherein, upon being fulfilled, the distance to fault is chosen.

16. Computer program product according to claim 15, characterised in that it defines $\underline{I}_p$, $\underline{I}_{pN}$ as $\underline{I}_{ph}$ - when measurements are in the feeder, $$I_p = I_{ph} - (1 - \underline{k}_z)\frac{V_{ph} - V_0}{Z_{pre}}$$

when measurements are at the substation, and
$\underline{I}_N = \underline{I}_A + \underline{I}_B + \underline{I}_C$ - when measurements are in the feeder, $$I_{pN} \quad I_N - \frac{(1 - k_{zk0})\underline{V}_0}{-jX_{C0}}$$

when measurements are at the substation, where: $\underline{V}_0 = (\underline{V}_A + \underline{V}_B + \underline{V}_C)/3$, $$k_{zk0} = \frac{X_{C0}}{X_{C0k}} = \frac{C_{0k}}{C_{C0}}$$

$C_{0k}$ - zero-sequence capacitance of the faulty feeder,
$C_{C0}$ - zero-sequence capacitance of the whole MV network, $$\underline{k}_z = \frac{\underline{S}_{lk}}{\underline{S}_\Sigma}$$

$\underline{S}_{1k}$ and $\underline{S}_\Sigma$ pre-fault loads of the faulty line and all the lines, respectively.

17. Computer program product according to claim 16 for a phase-to-ground fault, characterised by calculating impedance $\underline{Z}_{1f}$ according to $$Z_{1f} = \frac{V_{ph}}{I_p + \frac{Z_{0k}^f - Z_{1k}^f}{3Z_{1k}^f}I_{pN}},$$

assuming $\underline{Z}_{1f} = \underline{Z}_{1k}^f$ at the fault point and rearranging:
$\underline{Z}_{1f} = \underline{Z}_{1N} - \underline{k}_1 \underline{Z}_{0k}^f$
where:

$$\underline{k}_1 = \frac{I_{pN}}{3I_p - I_{pN}}, \quad Z_{1N} = \frac{V_{ph}}{I_p - I_{pN}/3},$$

calculating the residual impedance going through consecutive nodes as $$\Delta Z_f = \frac{Z_{ke}\left(xZ_{Le} + \frac{R_f((1-x)Z_{Le} + Z_{e(k+1)}^u)}{R_f + (1-x)Z_{Le} + Z_{e(k+1)}^u}\right)}{Z_{ke} + xZ_{Le} + \frac{R_f((1-x)Z_{Le} + Z_{e(k+1)}^u)}{R_f + (1-x)Z_{Le} + Z_{e(k+1)}^u}},$$

calculating distance x from node to fault as $$x = \frac{\operatorname{Im}(Z_{Le}) - \sqrt{p}}{2\operatorname{Im}\left(\frac{Z_{Le}^2(\Delta Z_f - Z_{ke})}{M}\right)}$$

and continuing until x<1.

18. Computer program product according to claim 16 for a phase-to-phase fault, characterised by calculating impedance $\underline{Z}_{1f}$ according to $$Z_{1f} = \frac{V_{pp}}{I_{pp}}$$

where: $\underline{V}_{pp}$ - phase-phase voltage, $\underline{I}_{pp}$ - phase-phase current, e.g. for A-B fault: $\underline{V}_{pp} = \underline{V}_A - \underline{V}_B$, $\underline{I}_{pp} = \underline{I}_A - \underline{I}_B$, calculating the residual impedance going through consecutive nodes as $$\Delta Z_f = \frac{Z_{1k}\left(xZ_L + \frac{R_f((1-x)Z_L + Z_{1(k+1)}^u)}{R_f + (1-x)Z_L + Z_{1(k+1)}^u}\right)}{Z_{1k} + xZ_L + \frac{R_f((1-x)Z_L + Z_{1(k+1)}^u)}{R_f + (1-x)Z_L + Z_{1(k+1)}^u}},$$

calculating distance x from node to fault as $$x = \frac{\operatorname{Im}(Z_L) - \sqrt{p}}{2\operatorname{Im}\left(\frac{Z_L^2(\Delta Z_f - Z_{1k})}{M}\right)},$$

and continuing until x<1.

19. Use of a computer program product according to claim 15 to determine a distance to a fault in a Medium Voltage power distribution network.

20. A computer readable medium comprising computer code means according to claim 15.

* * * * *